United States Patent
Cho et al.

(10) Patent No.: US 10,025,437 B2
(45) Date of Patent: Jul. 17, 2018

(54) DISPLAY DEVICE AND TOUCH SENSING METHOD THEREOF

(71) Applicant: Samsung Display Co., Ltd., Yongin, Gyeonggi-Do (KR)

(72) Inventors: Se Hyoung Cho, Hwaseong-si (KR); Kyung-Hoon Kim, Uiwang-si (KR); Kang Moon Jo, Seoul (KR); Dong Woo Kim, Seongnam-si (KR); Il Gon Kim, Seoul (KR)

(73) Assignee: Samsung Display Co., Ltd. (KR)

( * ) Notice: Subject to any disclaimer, the term of this patent is extended or adjusted under 35 U.S.C. 154(b) by 44 days.

(21) Appl. No.: 14/818,677

(22) Filed: Aug. 5, 2015

(65) Prior Publication Data
US 2016/0216800 A1  Jul. 28, 2016

(30) Foreign Application Priority Data
Jan. 27, 2015  (KR) .................. 10-2015-0013040

(51) Int. Cl.
*G06F 3/041* (2006.01)
*G06F 3/044* (2006.01)
(Continued)

(52) U.S. Cl.
CPC .......... *G06F 3/044* (2013.01); *G02F 1/13338* (2013.01); *G06F 3/0412* (2013.01); *G06F 3/0416* (2013.01); *G09G 3/3208* (2013.01); *G09G 3/3233* (2013.01); *G09G 3/3258* (2013.01); *G09G 3/3291* (2013.01); *H01L 25/167* (2013.01); *H01L 27/323* (2013.01); *H01L 27/3225* (2013.01); *G02F 1/133603* (2013.01); *G06F 2203/04111* (2013.01);
(Continued)

(58) Field of Classification Search
CPC ...... G06F 3/0412; G06F 3/0416; G06F 3/044; G06F 3/041; G06F 2203/04111; G06F 3/04105; G09G 3/3233; G09G 3/3258; G09G 3/3291; G09G 3/3208; G09G 2300/0426; G09G 2300/0842; G09G 2320/0295; G02F 1/13338; G02F 1/133603; H01L 27/323; H01L 27/3248; H01L 27/3244; H01L 27/3225; H01L 25/167

See application file for complete search history.

(56) References Cited

U.S. PATENT DOCUMENTS 9,360,978 B2 * 6/2016 Pak .................. G06F 3/0412
9,406,260 B2 * 8/2016 Jeong ................ G09G 3/3258
(Continued)

FOREIGN PATENT DOCUMENTS

| KR | 1020120078355 A | 7/2012 |
| KR | 1020140032344 A | 3/2014 |
| KR | 1021040041154 A | 4/2014 |

*Primary Examiner* — Dismery Mercedes
(74) *Attorney, Agent, or Firm* — Innovation Counsel LLP

(57) ABSTRACT

In a display device, a driving element is disposed on a rear substrate, and a passivation layer covers the driving element. A pixel electrode is disposed on the passivation layer and is connected to the driving element. An organic emission layer is disposed on the pixel electrode and is configured to emit light toward the rear substrate. A common electrode is disposed on the organic emission layer. A touch electrode is disposed between the rear substrate and the passivation layer, and it forms a capacitive component when an external touch occurs.

6 Claims, 24 Drawing Sheets

(51) Int. Cl.
*G09G 3/3208* (2016.01)
*G09G 3/3233* (2016.01)
*H01L 27/32* (2006.01)
*H01L 25/16* (2006.01)
*G09G 3/3258* (2016.01)
*G02F 1/1333* (2006.01)
*G09G 3/3291* (2016.01)
*G02F 1/1335* (2006.01)

(52) U.S. Cl.
CPC .............. *G09G 2300/0426* (2013.01); *G09G 2300/0852* (2013.01); *G09G 2320/0295* (2013.01)

(56) References Cited

U.S. PATENT DOCUMENTS

| | | | |
|---|---|---|---|
| 9,507,449 B2* | 11/2016 | Chang | G06F 3/041 |
| 9,570,010 B2* | 2/2017 | Yang | G09G 3/32 |
| 9,871,082 B2* | 1/2018 | Jeon | G06F 3/0416 |
| 2006/0022907 A1* | 2/2006 | Uchino | G09G 3/3233 345/76 |
| 2008/0291223 A1* | 11/2008 | Yamazaki | G09G 3/3614 345/690 |
| 2010/0026639 A1* | 2/2010 | Lee | G06F 3/0412 345/173 |
| 2011/0037729 A1 | 2/2011 | Cho et al. | |
| 2011/0073384 A1* | 3/2011 | Osoinach | G06F 3/0416 178/18.06 |
| 2011/0128254 A1* | 6/2011 | Teranishi | G06F 3/044 345/174 |
| 2011/0254871 A1* | 10/2011 | Yoo | G09G 3/3233 345/690 |
| 2012/0280965 A1* | 11/2012 | Lee | G09G 3/3677 345/212 |
| 2013/0265244 A1* | 10/2013 | Kim | G06F 3/044 345/173 |
| 2013/0335366 A1* | 12/2013 | Lee | G06F 3/044 345/174 |
| 2014/0049490 A1* | 2/2014 | Guo | G06F 3/041 345/173 |
| 2014/0132559 A1* | 5/2014 | Kim | G06F 3/0416 345/174 |
| 2014/0168157 A1* | 6/2014 | Yang | G06F 3/044 345/174 |
| 2015/0077411 A1* | 3/2015 | Miyake | G09G 3/3233 345/212 |
| 2015/0185901 A1* | 7/2015 | Hsu | G06F 3/0416 345/174 |
| 2015/0185937 A1* | 7/2015 | Lee | G06F 3/0412 345/173 |
| 2015/0221255 A1* | 8/2015 | Qing | G06F 3/0412 345/173 |
| 2016/0147368 A1* | 5/2016 | Kim | G06F 3/044 345/174 |
| 2016/0148036 A1* | 5/2016 | Kim | G06K 9/0002 382/124 |
| 2016/0170531 A1* | 6/2016 | Lee | G06F 3/044 345/174 |
| 2016/0188041 A1* | 6/2016 | Kim | G06F 3/044 345/174 |
| 2016/0188116 A1* | 6/2016 | Kim | G06F 3/0418 345/174 |
| 2016/0189599 A1* | 6/2016 | Lee | H02H 3/087 345/211 |
| 2016/0232834 A1* | 8/2016 | Kimura | G09G 3/3233 |

\* cited by examiner

DISPLAY DEVICE AND TOUCH SENSING METHOD THEREOF

RELATED APPLICATIONS

This application claims priority to and the benefit of Korean Patent Application No. 10-2015-0013040 filed in the Korean Intellectual Property Office on Jan. 27, 2015, the entire contents of which are incorporated herein by reference.

BACKGROUND (a) Field

The described technology relates generally to a display device and a touch sensing method thereof, and particularly relates to an organic light emitting device having a touch sensing function and a touch sensing method thereof.

(b). Description of the Related Art

Among display devices, since an organic light emitting diode (OLED) display as a self-light emitting type that does not require a separate light source, it is advantageous in terms of power consumption, response speed, viewing angle, and contrast ratio.

The organic light emitting diode (OLED) display includes a plurality of pixels such as red pixels, blue pixels, green pixels, and white pixels, and may express full colors by combining the pixels. Each pixel includes a light emitting element, and a plurality of thin film transistors for driving the light emitting element.

The light emitting element of the organic light emitting diode (OLED) display includes a pixel electrode, a common electrode, and an emission layer positioned between the two electrodes. One of the pixel electrode and the common electrode becomes an anode and the other becomes a cathode. Electrons injected from the cathode and holes injected from the anode are coupled with each other in the light emitting layer to form excitons, and the excitons emit light while discharging energy. The common electrode is formed throughout a plurality of pixels to transmit a predetermined common voltage.

The OLED display may be divided into a bottom emission type in which light is emitted to the bottom of a substrate and a top emission type in which light is emitted to the top of the substrate. In the case of the top emission type of OLED display, the common electrode may be made of a transparent conductive material.

On the other hand, recently, a display device having a function of sensing external touch of a finger, etc., of a person has been actively developed. The external touch sensing function means a function in which it is capable of sensing touch information such as a touch existence and a touch position when an external object such as the finger or a touch pen approaches or contacts a screen. This function may allow a machine such as a computer, etc., to perform a desired command by touching a finger or a touch pen (or stylus) to a screen of the touch panel to write or draw characters or execute icons.

In this instance, a glass substrate for a touch may be formed on a substrate to provide the touch sensing function to the bottom emission type of organic light emitting device. However, the organic light emitting device becomes thicker and heavier because of the glass substrate used for a touch.

SUMMARY

Embodiments provide a display device having a touch sensing function, and a touch sensing method thereof.

An embodiment provides a display device including a rear substrate, a driving element disposed on the rear substrate, a passivation layer covering the driving element, a pixel electrode disposed on the passivation layer and connected to the driving element, an organic emission layer disposed on the pixel electrode and configured to emit light toward the rear substrate, a common electrode disposed on the organic emission layer, and a touch electrode disposed between the rear substrate and the passivation layer and configured to form a capacitance component when a touch is generated.

The touch electrode may be connected to the pixel electrode.

The display device may further include a buffer layer disposed between the rear substrate and the driving element. The touch electrode may be disposed between the rear substrate and the buffer layer.

The touch electrode may cover the organic emission layer and include a transparent conductive material.

The touch electrode may expose the organic emission layer and include a reflective conductive material.

The touch electrode may be disposed on a same layer as a semiconductor layer of the driving element and include a semiconductor material.

The display device may further include a sensing element disposed on a same layer as the driving element and configured to transmit a sensing signal for sensing a touch. The touch electrode may be connected to the sensing element.

The display device may further include an auxiliary electrode disposed on a same layer as the pixel electrode and separated from the pixel electrode. The auxiliary electrode may be connected to the touch electrode.

The driving element may include a first gate electrode and a second gate electrode disposed on the first gate electrode, and the touch electrode may be disposed on a same layer as the first gate electrode.

The touch electrode may include a transparent conductive material.

Another embodiment provides a display device including at least one signal line configured to transmit a data signal and a sensing signal, a scan line configured to transmit a scan signal, a pixel, and sensing signal processor. The pixel includes a touch electrode for storing a voltage corresponding to the sensing signal for a first period when an external touch occurs, and is disposed in a region defined by the signal line and the scan line. The sensing signal processor is configured to measure a voltage stored in the touch electrode through the signal line for a second period after the first period, measure a voltage of the signal line for a third period after the second period, and sense the external touch based upon a difference between the voltage measured for the second period and the voltage measured for the third period.

The pixel may further include a switching transistor configured to transmit the data signal in response to the scan signal, a capacitor configured to store a voltage corresponding to the data signal from the switching transistor, a driving transistor configured to output a current caused by the voltage stored in the capacitor, and an organic light emitting element configured to emit light according to the current from the driving transistor.

The touch electrode may be connected to a first terminal of the organic light emitting element.

The touch electrode may be connected to a gate electrode of the driving transistor.

The display device may further include a sensing transistor. The sensing transistor may be configured to be turned on for the first period to transmit a voltage stored in the touch electrode to the signal line.

The sensing transistor may include a first input/output terminal connected to the signal line and a second input/output terminal connected to the touch electrode.

The signal line may include a data line configured to transmit the data signal and a sensing line configured to transmit the sensing signal.

The signal line may include a data line configured to transmit the data signal for a displaying period and to transmit the sensing signal for a touch sensing period.

The touch sensing period may include the first period, the second period, and the third period.

The sensing signal processor may include an operational amplifier including a first input terminal connected to the signal line, a second input terminal configured to receive a reference voltage, and an output terminal, a first capacitor, a second capacitor, a first switching element connected between the output terminal and the first capacitor and configured to be turned on for the second period, and a second switching element connected between the output terminal and the second capacitor and configured to be turned on for the third period.

Another embodiment provides a touch sensing method by a display device including at least one signal line for transmitting a data signal and a sensing signal, a scan line for transmitting a scan signal, and a pixel disposed in a region defined by the signal line and the scan line and including a touch electrode.

The touch sensing method includes storing a voltage corresponding to the sensing signal in the touch electrode for a first period when an external touch is generated, measuring the voltage stored in the touch electrode through the signal line for a second period after the first period, measuring the voltage at the signal line for a third period after the second period, and sensing the external touch based upon a difference between the voltage measured for the second period and the voltage measured for the third period.

DETAILED DESCRIPTION

Figure 1:
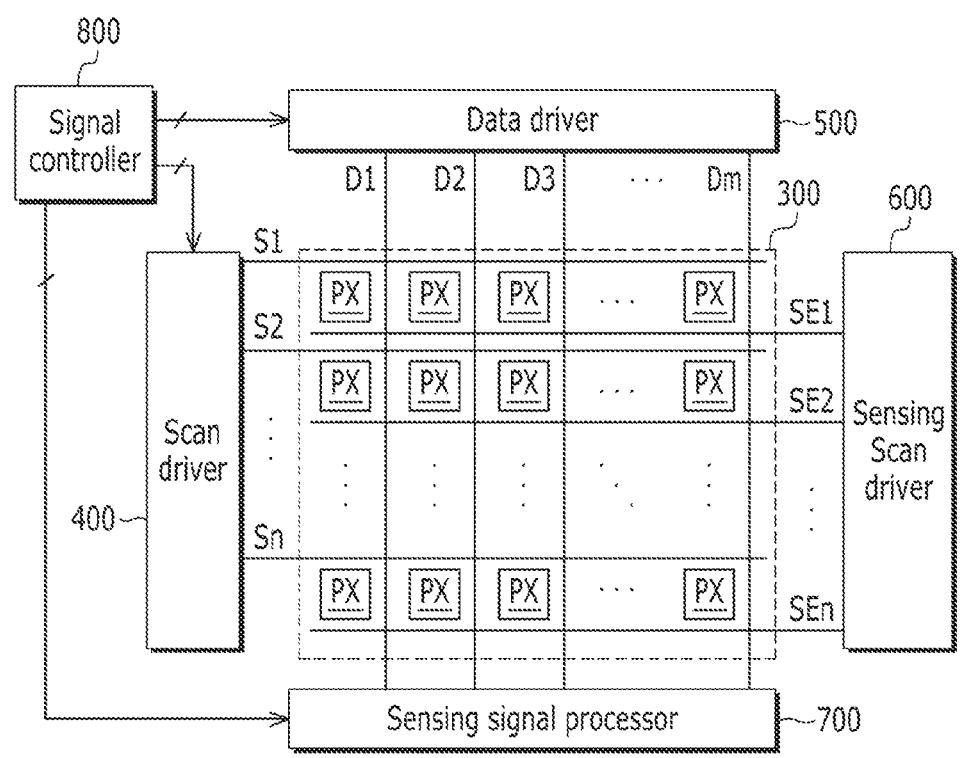
FIG. 1 shows a block diagram of an organic light emitting device according to an embodiment.

In the following detailed description, only certain embodiments have been shown and described, simply by way of illustration. As those skilled in the art would realize, the described embodiments may be modified in various different ways, all without departing from the spirit or scope of the inventive concept. Accordingly, the drawings and description are to be regarded as illustrative in nature and not restrictive. Like reference numerals designate like elements throughout the specification.

Figure 2:
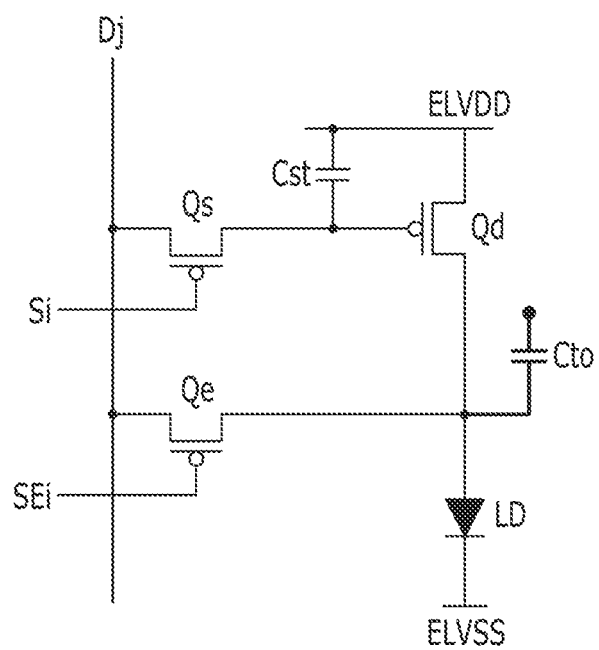
FIG. 2 shows an equivalent circuit diagram of one pixel of an organic light emitting device according to an embodiment.
Figure 3:
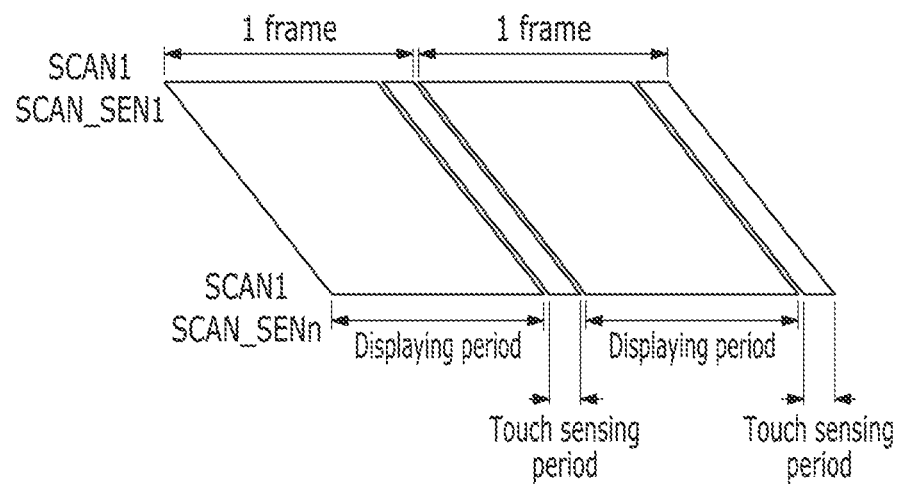
FIG. 3 shows one frame of an organic light emitting device according to an embodiment.

FIG. 1 shows a block diagram of an organic light emitting device according to an embodiment, FIG. 2 shows an equivalent circuit diagram of one pixel of an organic light emitting device according to an embodiment, and FIG. 3 shows one frame of an organic light emitting device according to an embodiment.

Referring to FIG. 1, the organic light emitting device includes a display panel 300, a scan driver 400, a data driver 500, a sensing scan driver 600, a sensing signal processor 700, and a signal controller 800.

Referring to FIG. 1, the display panel 300 includes a plurality of signal lines S1-Sn, D1-Dm and SE1-SEn and a plurality of pixels PX connected thereto and arranged substantially in a matrix form.

The signal lines S1-Sn, D1-Dm and SE1-SEn include a plurality of scan lines S1-Sn for transmitting a scan signal, a plurality of data lines D1-Dm for transmitting a data signal according to an input image signal, and a plurality of sensing signal lines SE1-SEn for transmitting a scan signal for sensing a touch. The scan lines S1-Sn extend substantially in a row direction and are substantially parallel with each other, and the data lines D1-Dm extend substantially in a column direction and are substantially parallel with each other. A plurality of pixels PX are respectively formed in regions defined by the scan lines S1-Sn and the data lines D1-Dm.

The sensing signal lines SE1-SEn extend substantially in the row direction, are substantially parallel with each other, and are connected to the pixel PX of the corresponding row. In an embodiment, one sensing signal line may be connected to a pixel bunch of a plurality of rows. In this case, the pixel bunch defined by a plurality of rows corresponding to one sensing signal line and at least one column may define a sensing region.

In an embodiment, the signal lines may further include a plurality of sensing lines (not shown) for transmitting a sensing signal. The sensing lines extend substantially in the column direction, are substantially parallel with each other, and are connected to the pixels PX of the corresponding columns. In an embodiment, one sensing line may be connected to a pixel bunch of a plurality of columns. In this case, the pixel bunch defined by at least one row and a plurality of columns corresponding to one sensing line may define a sensing region.

In an embodiment, a pixel bunch defined by a plurality of rows corresponding to one sensing signal line and a plurality of columns corresponding to one data line or one sensing line may define a sensing region.

The scan driver 400 is connected to the scan lines S1-Sn of the display panel 300, and applies a scan signal that is a combination of a voltage with a level for turning on a switching transistor of the pixel PX and a voltage with a level for turning it off to the scan lines S1-Sn.

The data driver 500 is connected to the data lines D1-Dm of the display panel 300, and applies a data voltage to the data lines D1-Dm. The data driver 500 may select a data voltage from among all gray voltages relating to luminance of a pixel PX, or may divide gray voltages of a limited number to generate a desired data voltage.

The sensing scan driver 600 is connected to the sensing scan lines (SE1-SEn) of the display panel 300, and applies a sensing scan signal that is a combination of the voltage for turning on the switching transistor of the pixel PX and the voltage for turning it off to the sensing scan lines SE1-SEn.

The sensing signal processor 700 is connected to the data lines D1-Dm, and senses a sensing state in the sensing region defined by the sensing scan line for transmitting the corresponding sensing scan signal and the corresponding data line through the signal that is transmitted through the data lines D1-Dm according to the sensing scan signal, in an embodiment, the sensing signal processor 700 is connected to a sensing line (not shown) to sense a sensing state in the sensing region defined by the sensing scan line and the sensing line according to the signal transmitted through the sensing line.

The signal controller 800 controls the scan driver 400, the data driver 500, the sensing scan driver 600, and the sensing signal processor 700.

The driving devices 400, 500, 600, 700, and 800 may be directly mounted as at least one single IC chip on the display panel 300, may be mounted on a flexible printed circuit film (not shown) and be attached as a tape carrier package (TCP) to the display panel 300, or may be mounted on an additional printed circuit board (PCB) (not shown). Differing from this, the driving devices 400, 500, 600, 700 and 800 may be integrated on the display panel 300 together with the signal lines D1-Dm, and SE1-SEn and switching transistors. Further, the driving devices 400, 500, 600, 700, and 800 may be integrated into a single chip, and in this case, at least one of them or at least one circuit element configuring them may be provided outside the single chip.

Referring to FIG. 2, for example, the pixel PX connected to the i-th (i=1, 2, . . . , n) scan line Si and the j-th (j=1, 2, . . . , m) data line Dj includes a switching transistor Qs, a driving transistor Qd, a sensing transistor Qe, a storage capacitor Cst, and an organic light emitting element LD.

The switching transistor Os includes a control terminal connected to the scan line Si, a first input/output terminal connected to the data line Dj, and a second input/output terminal connected to a control terminal of the driving transistor Qd. The switching transistor Qs transmits the data signal provided through the data line Dj to the driving transistor Qd in response to the scan signal provided through the scan line Si.

The driving transistor Qd includes a control terminal connected to the second input/output terminal of the switching transistor Qs, a first input/output terminal connected to a driving voltage line (ELVDD), and a second input/output terminal connected to the organic light emitting element LD. The driving transistor Qd outputs an output current that is variable by a voltage between the control terminal and the second input/output terminal.

The capacitor Cst is connected between the control terminal of the driving transistor Qd and the first input/output terminal. The capacitor Cst charges the data signal applied to the control terminal of the driving transistor Qd and maintains the same when the switching transistor Qs is turned off.

The organic light emitting element LD tray exemplarily be an organic light emitting diode (OLED), and may include an anode connected to the second input/output terminal of the driving transistor Qd and a cathode connected to the common voltage ELVSS. The organic light emitting element LD displays an image by differentiating intensity according to an output current of the driving transistor (Qd) and emitting light. The organic light emitting element LD may include an organic material for properly emitting one or at least one of primary colors (i.e., red, green, and blue) or may include an organic material for emitting white, and the organic light emitting device may display the desired image with a spatial sum of the colors.

The sensing transistor e includes a control terminal connected to the sensing scan line SEi, a first input/output terminal connected to the data line Dj and a second input/output terminal connected to the anode of the organic light emitting element LD. The sensing transistor Qs transmits the voltage at the anode of the organic light emitting element LD to the data line Dj in response to the sensing control signal provided through the sensing scan line SEi.

A touch electrode (not shown) is connected to the anode of the organic light emitting element LD, and the touch electrode forms a touch sensing capacitor Cto with an external touch on a rear substrate as another electrode. In one embodiment, the touch electrode may include a conductive material. In another embodiment, the touch electrode may include a semiconductor material. Here, a buffer layer (not shown) formed between the anode and the rear substrate may function as a dielectric layer. The touch sensing capacitor Cto charges the sensing signal applied to the anode of the organic light emitting element LD.

The switching transistor Qs, the driving transistor Qd and the sensing transistor Qe are p-channel electric field effect transistors (FETs), but at least one of them may be an n-channel electric field effect transistor. In this case, the control terminal is a gate electrode, one of the first input/output terminal and the second input/output terminal is a source electrode, and the other thereof is a drain electrode. Further, connections among the transistors Qs, Qd, and Qe, the capacitor Cst, and the organic light emitting element LD may be changed.

Referring to FIG. 3, one frame is divided into a displaying period for the organic light emitting device to perform a displaying operation and a touch sensing period for the organic light emitting device to sense a touch. During the displaying period, low-level scan signals SCAN1-SCANn are sequentially applied to a plurality of scan lines S1-Sn, and a data signal is applied to a plurality of data lines D1-Dm while the low-level scan signals SCAN1-SCANn are applied. During the touch sensing period, low-level sensing scan signals SCAN_SEN1-SCAN_SENn are sequentially applied to a plurality of sensing scan lines SEN1-SENn and a sensing signal is applied to a plurality of data lines D1-Dm while the low-level sensing scan signals SCAN_SEN1-SCAN_SENn are applied. Accordingly, the organic light emitting device may perform the display operation based upon the data signal for the displaying period and may perform the touch sensing operation based upon the sensing signal for the touch sensing period.

Figure 4:
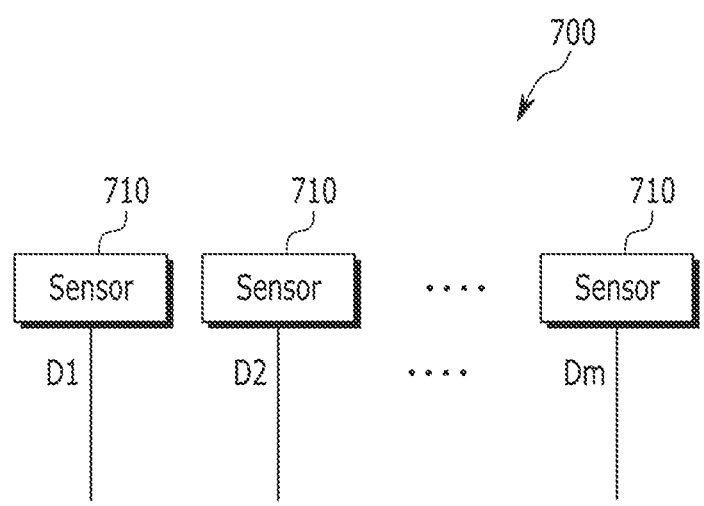
FIG. 4 shows a block diagram of a sensing signal processor of a display device according to an embodiment.
Figure 5:
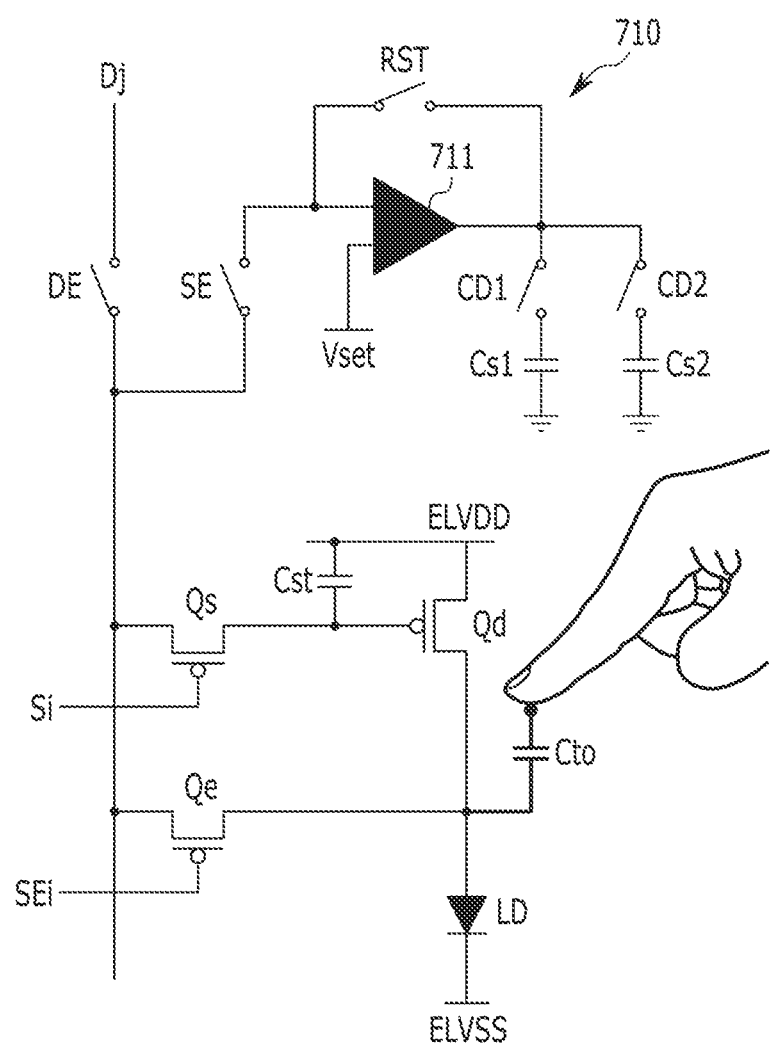
FIG. 5 shows a connection relationship between a sensor and a pixel in a display device according to an embodiment.

FIG. 4 shows a block diagram of a sensing signal processor of a display device according to an embodiment, and FIG. 5 shows a connection relationship between a sensor and a pixel in a display device according to an embodiment FIG. 5 shows a case in which a sensor 710 is connected to one data line Dj and one pixel PX is connected to the data line Dj.

Referring to FIG. 4, the sensing signal processor 700 includes a plurality of sensors 710 each of which is connected to at least one corresponding data line.

Referring to FIG. 5, the sensor 710 includes an operational amplifier 711, capacitors Cs1 and Cs2, and switching elements SE, RST, CD1, and CD2.

A reference voltage Vset is applied to a first input terminal of the operational amplifier 711.

The switching element SE is connected between a second input terminal of the operational amplifier 711 and a corresponding data line Dj. The switching element SE is turned on in response to a switching control signal SSE, and transmits a voltage of the data line Dj to the second input terminal of the operational amplifier 711 for the sensing period for performing a touch sensing operation in the organic light emitting device.

The switching element RST is connected between the second input terminal and an output terminal of the operational amplifier 711, and is turned on in response to a switching control SRST to allow the operational amplifier 711 to function as a unit gain operational amplifier, that is, a buffer.

The switching element CD1 is connected between the output terminal of the operational amplifier 711 and a first terminal of the capacitor Cs1 and a second terminal of the capacitor Cs1 is connected to a predetermined power terminal, such as a ground. The switching element CD1 charges an output voltage of the operational amplifier 711 into the capacitor Cs1 in response to a switching control signal SCD1.

The switching element CD2 is connected between the output terminal of the operational amplifier 711 and the first terminal of the capacitor Cs2, and a second terminal of the capacitor Cs2 is connected to a predetermined power terminal, such as the ground. The switching element CD2 charges the output voltage of the operational amplifier 711 into the capacitor Cs2 in response to the switching control signal SCD2.

The sensor 710 determines a touching state based upon a difference between the voltages charged in the capacitors Cs1 and Cs2.

A switching element DE may be connected between the data driver 500 and the data line Dj. The switching element DE is turned on in response to a switching control signal SDE, and transmits the data signal provided by the data driver 500 to the data line Dj for the displaying period for performing a displaying operation in the organic light emitting device.

Figure 6:
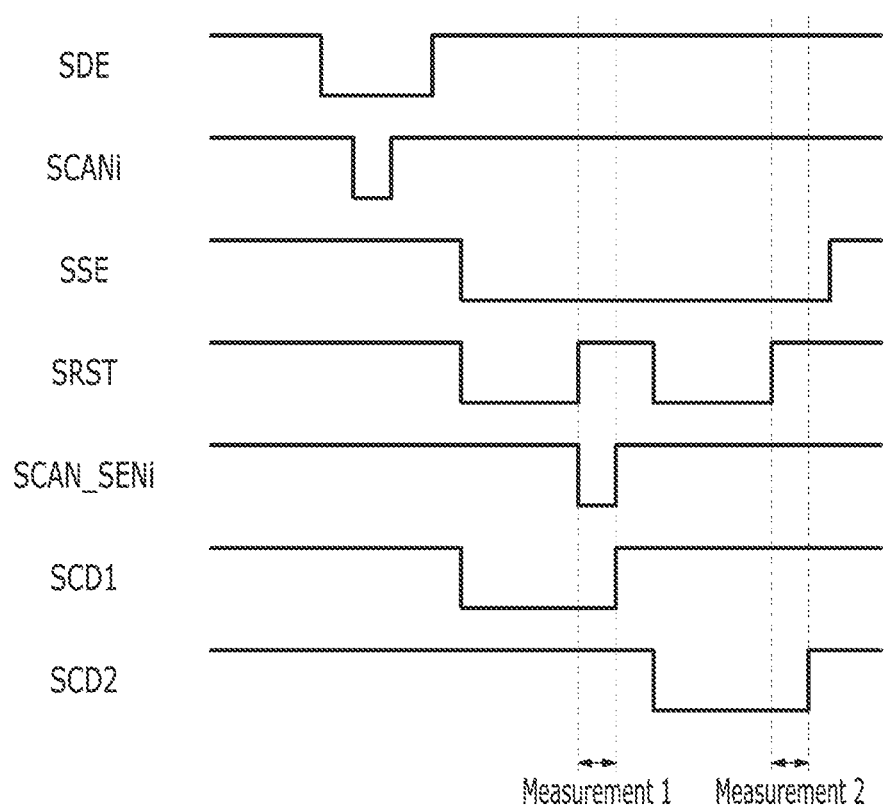
FIG. 6 shows signal timing during a sensing period in an organic light emitting device according to an embodiment.

FIG. 6 shows signal timing during a sensing period in an organic light emitting device according to an embodiment. It is assumed in FIG. 6 that the switching elements shown in FIG. 5 are p-channel electric field effect transistors.

Referring to FIG. 5 and FIG. 6, during the sensing period, the switching element DE is turned on in response to the low-level switching control signal SDE, and the data driver 500 applies a sensing signal to the data line D. A low-level scan signal SCANi is applied to the scan line Si, and the transistor Qs is turned on in response to the low-level scan signal SCANi. Therefore, the voltage corresponding to the sensing signal is stored in the capacitor Cst, and the driving transistor Qd outputs a current by the voltage stored in the capacitor Cst. Here, when a touch is generated, the voltage corresponding to the sensing signal is stored in the touch sensing capacitor Cto. That is the voltage corresponding to the sensing signal is applied to the anode of the organic light emitting element LD. When there is no touch, no touch sensing capacitor Cto is formed and the voltage corresponding to the sensing signal is not charged into the anode.

The scan signal SCANi is switched to a high level and the switching control signal SDE is switched to a high level. The switching control signals SSE, SRST and SCD1 are switched to a low level. The switching element SE is turned on to connect the data line Dj and the sensor 710. The switching element RST is turned on to connect the second input terminal and the output terminal of the operational amplifier 711 to allow the operational amplifier 711 to function as the unit gain operational amplifier. The output terminal of the operational amplifier 711 and the capacitor Cs1 are connected. Therefore, the voltage charged in the capacitor Cs1 is reset by the operational amplifier 711, and a noise component existing in the data line Dj may be charged in the capacitor Cs1.

The switching control SRST is switched to the high level to turn off the switching element RST, and the sensing control signal SCAN_SENi provided through the sensing scan line SEi is switched to the low level to turn on the sensing transistor Qe. When a touch is generated, a current is supplied to the operational amplifier 711 through the data line Dj from the touch sensing capacitor Cto by the voltage charged in the touch sensing capacitor Ctn. In this instance since the switching element RST is turned off, the operational amplifier 711 works as a comparator and charges the voltage that corresponds to a comparison result of the voltage charged in the touch sensing capacitor Cto and a reference voltage Vset into the capacitor Cs1. That is, the sensing signal processor 700 measures the voltage charged in the touch sensing capacitor Cto through the data line Dj.

The sensing control signal SCAN_SENi and the switching control signal SCD1 are switched to the high level and the switching control signals (SRST and SCD2) are switched to the low level. Therefore, the switching element RST is turned on to allow the operational amplifier 711 to function as the unit gain operational amplifier and connect an output terminal of the operational amplifier 711 to the capacitor Cs2. The voltage charged in the capacitor Cs1 is reset by the operational amplifier 711, and the noise component existing in the data line Dj is charged in the capacitor Cs2. That is, the sensing signal processor 700 measures the voltage at the data line Dj.

The sensing signal processor 700 determines a touching state through a difference between the voltage stored in the capacitor Cs1 and the voltage stored in the capacitor Cs2. When the noise component existing in the data line Dj is stored in the capacitor Cs1, the same noise component is stored in the capacitor Cs2 and the noise component is removed through the difference of voltages stored in the capacitors Cs1 and Cs2. Hence, the sensing signal processor 700 may accurately determine the sensing without being influenced by the noise component.

Figure 7:
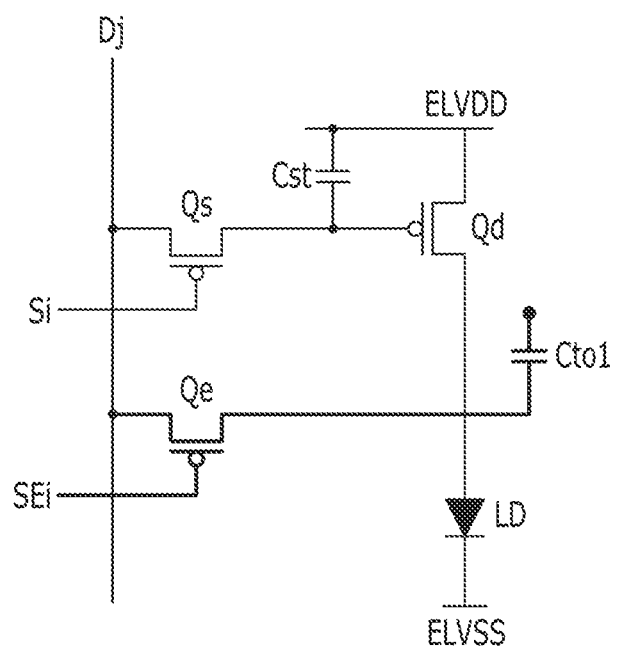
FIG. 7, FIG. 9, FIG. 10, FIG. 11, FIG. 12, FIG. 13, and FIG. 14 are equivalent circuit diagrams of one pixel of an organic light emitting device according to various embodiments.
Figure 8:
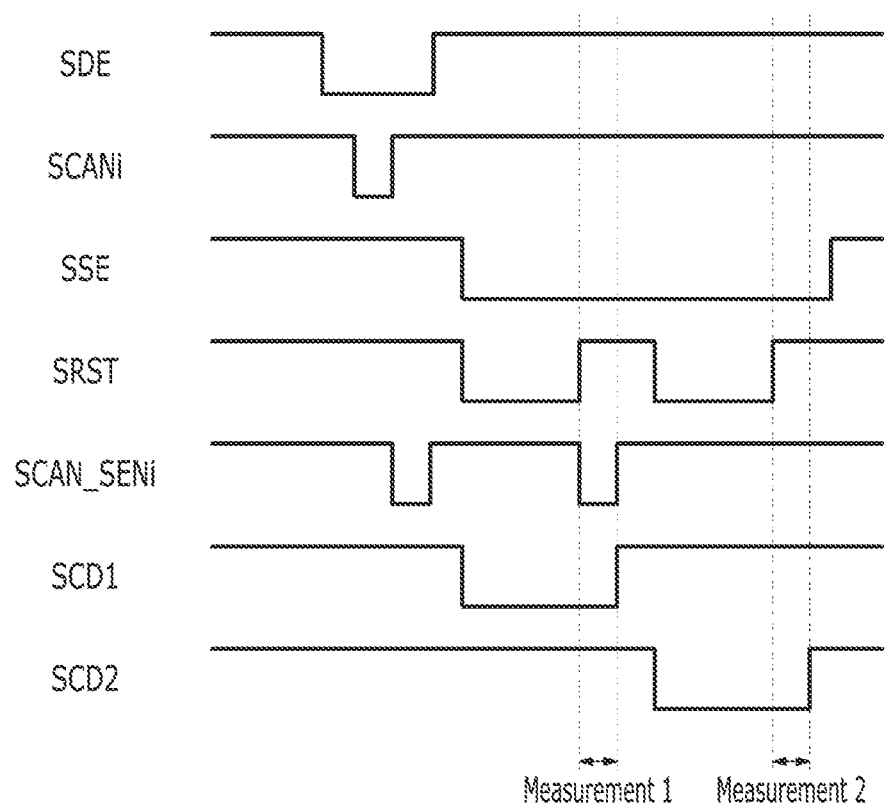
FIG. 8 shows signal timing during a sensing period in an organic light emitting device including one pixel shown in FIG. 7.
Figure 9:
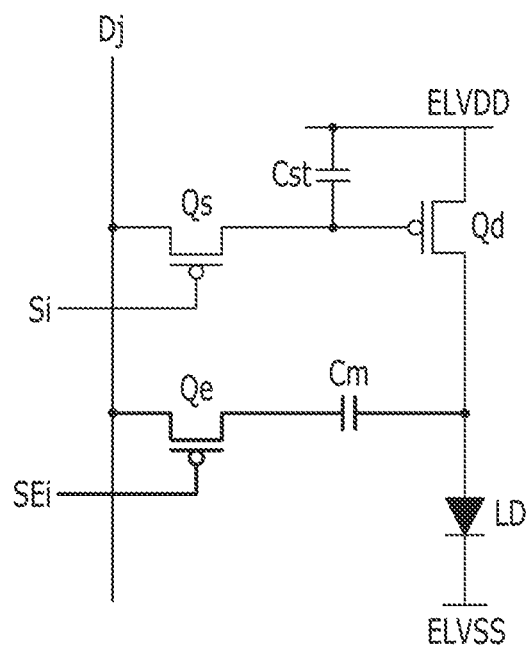
Figure 10:
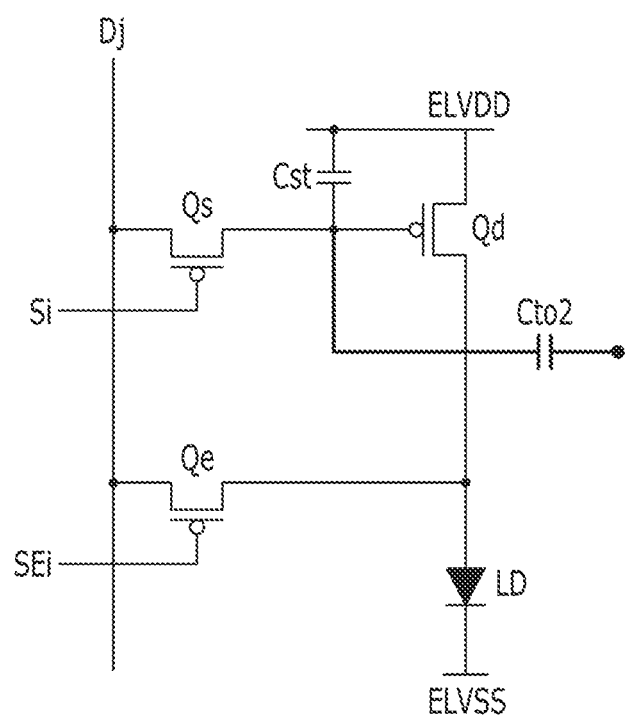
Figure 11:
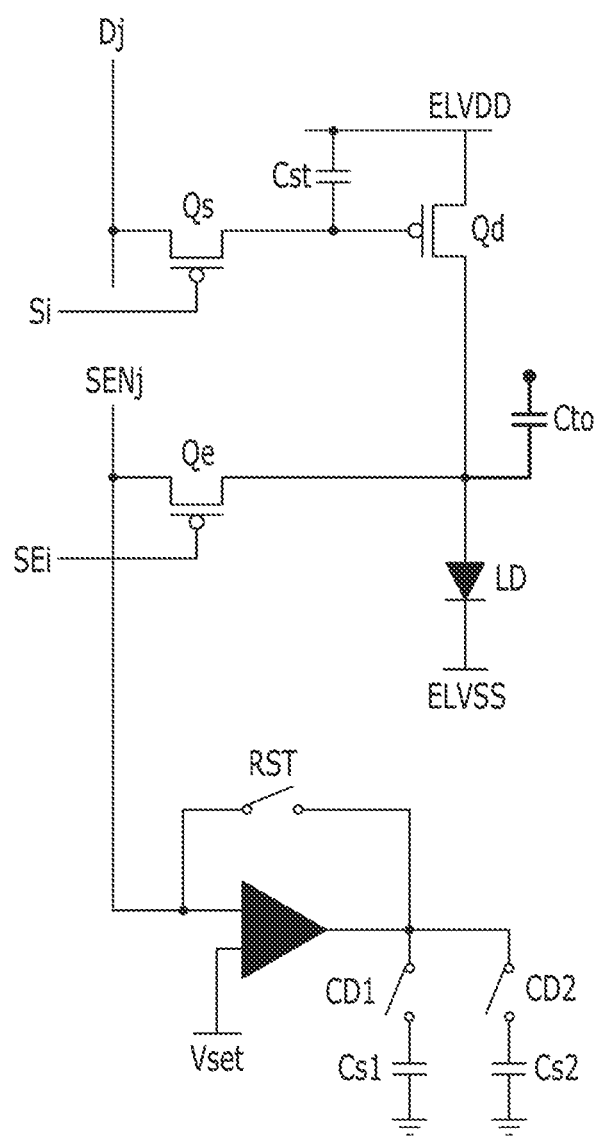
Figure 13:
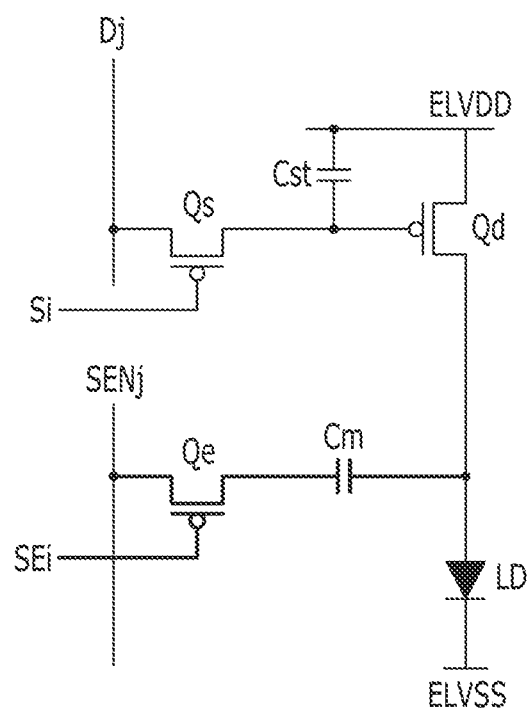
Figure 14:
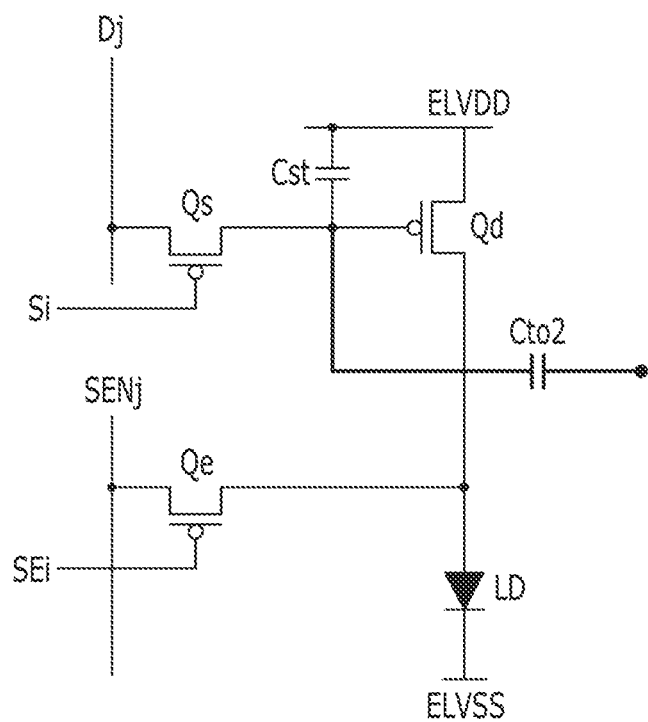
Figure 15:
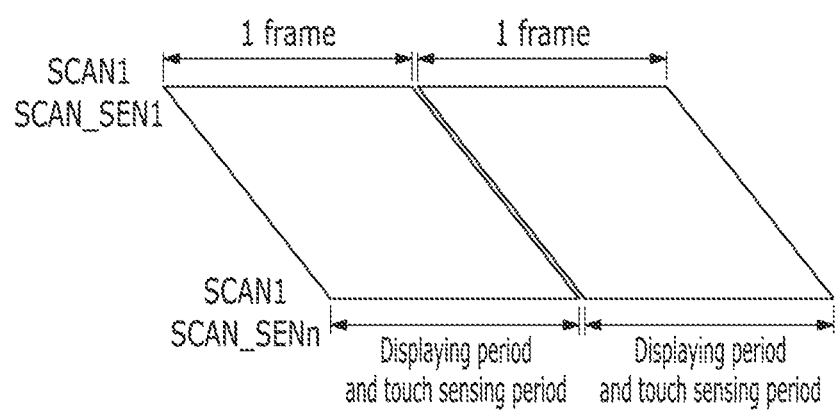
FIG. 15 shows one frame of an organic light emitting device according to another embodiment.

FIG. 7, FIG. 9, FIG. 10, FIG. 11, FIG. 12, FIG. 13, and FIG. 14 are equivalent circuit diagrams of one pixel of an organic light emitting device according to various embodiments, FIG. 8 shows signal timing during a sensing period in an organic light emitting device including one pixel shown in FIG. 7, and FIG. 15 shows one frame of an organic light emitting device according to another embodiment. FIG. 11 exemplifies a pixel and a sensor connected to it.

In an embodiment, as shown in FIG. 7, a touch electrode (not shown) is connected to the second input/output terminal of the sensing transistor Qe, and the touch electrode forms a touch sensing capacitor Cto1 with an external touch on the rear substrate as another electrode. A buffer layer (not shown) formed between the touch electrode and the rear substrate may function as a dielectric layer.

Referring to FIG. 7 and FIG. 8, differing from the signal timing shown in FIG. 6, while the switching control signal SDE has the low level and the sensing signal is transmitted from the data line Dj, the sensing control signal SCAN_SENi provided from the sensing scan line SENi is switched to the low level. The sensing transistor Qe is turned on and the touch sensing capacitor Cto1 charges the sensing signal transmitted through the data line Dj. When the sensing transistor Qe is turned on again, the voltage charged in the touch sensing capacitor Cto2 is transmitted to the sensor 710 and is then charged in the capacitor Cs1.

In another embodiment, as shown in FIG. 9, when a touch electrode (not shown) connected to the second input/output terminal of the sensing transistor Qe forms an electrode of the touch sensing capacitor Cto1, a capacitor Cm may be formed between the touch electrode and the anode of the organic light emitting element LD. A parasitic capacitance component formed by overlapping wires may be reduced by the capacitor Cm.

In another embodiment, as shown in FIG. 10, a touch electrode (not shown) is connected to the control terminal of the driving transistor Qd, and the touch electrode forms a touch sensing capacitor Cto2 with an external touch on the rear substrate as another electrode. A buffer layer (not shown) formed between the touch electrode and the rear substrate may function as a dielectric layer. The touch sensing capacitor Cto2 charges the sensing signal applied to the control terminal of the driving transistor Qd, and a voltage of the control terminal of the driving transistor Qd is determined by the voltage charged in the touch sensing capacitor Cto2. When the sensing transistor Qe is turned on, the driving transistor Qd transmits the current corresponding to the voltage of the control terminal to the sensor 710 through the data line Dj.

The organic light emitting device including the pixel PX described with reference to FIG. 10 may be operable by the signal timing shown in FIG. 6.

In another embodiment, as shown in FIG. 11, the sensing line SENj for transmitting the sensing signal may be formed to be separated from the data line Dj for transmitting the data signal in the pixel PX shown in FIG. 5. The display unit 100 may include a plurality of sensing lines respectively corresponding to a plurality of sensors 710 of FIG. 4, and the plurality of sensing lines may extend substantially in a column direction and may be parallel with each other.

In this case, the sensing transistor Qe is connected between the sensing line SENj and the anode of the organic light emitting element LD, and the input terminal of the sensor 710 is connected to the sensing line SENj. Therefore, differing from the pixel PX shown in FIG. 5, the switching elements (DE and SE) connected to the data line Dj may be omitted.

The organic light emitting device including the pixel PX exemplified in FIG. 11 may be operated with the signal timing shown in FIG. 6, except that the sensing signal is applied from the sensing line SENj while the low-level scan signal SCANi is applied from the scan line Si. In this case, the switch control signals (SDE and SSE) are not applied.

Figure 12:
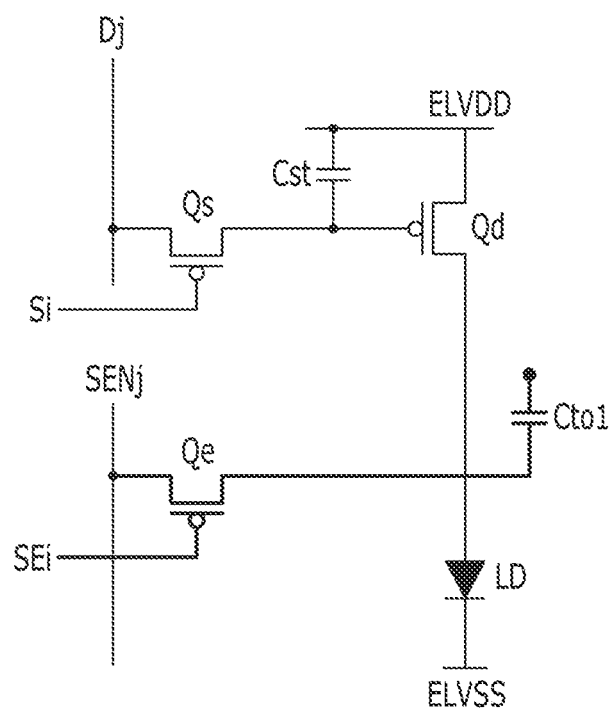

In another embodiment, as shown in FIG. 12, the sensing line SENj for transmitting the sensing signal may be formed to be separated from the data line Dj for transmitting the data signal in the pixel PX shown in FIG. 7.

In another embodiment, as shown in FIG. 13, the sensing line SENj for transmitting the sensing signal may be formed to be separated from the data line Dj for transmitting the data signal in the pixel PX shown in FIG. 9.

In another embodiment, as shown in FIG. 14, the sensing line SENj for transmitting the sensing signal may be formed to be separated from the data line Dj for transmitting the data signal in the pixel PX shown in FIG. 10.

Referring to FIG. 14, the sensing line SENj is separated from the data line Dj so the sensing signal transmitted through the sensing line SENj does not influence the data signal of the data line Dj. The second input/output terminal of the sensing transistor Qe is separated from the terminals of the driving transistor Qd and the organic light emitting element LD so the sensing signal transmitted through the sensing line SENj does not influence the driving transistor Qd and the organic light emitting element LD.

Therefore, the organic light emitting device including the pixel PX shown in FIG. 14 may perform the operation of the touch sensing period during the displaying period as shown in FIG. 15. That is, the organic light emitting device may perform the display operation and sense an external touch.

Figure 16:
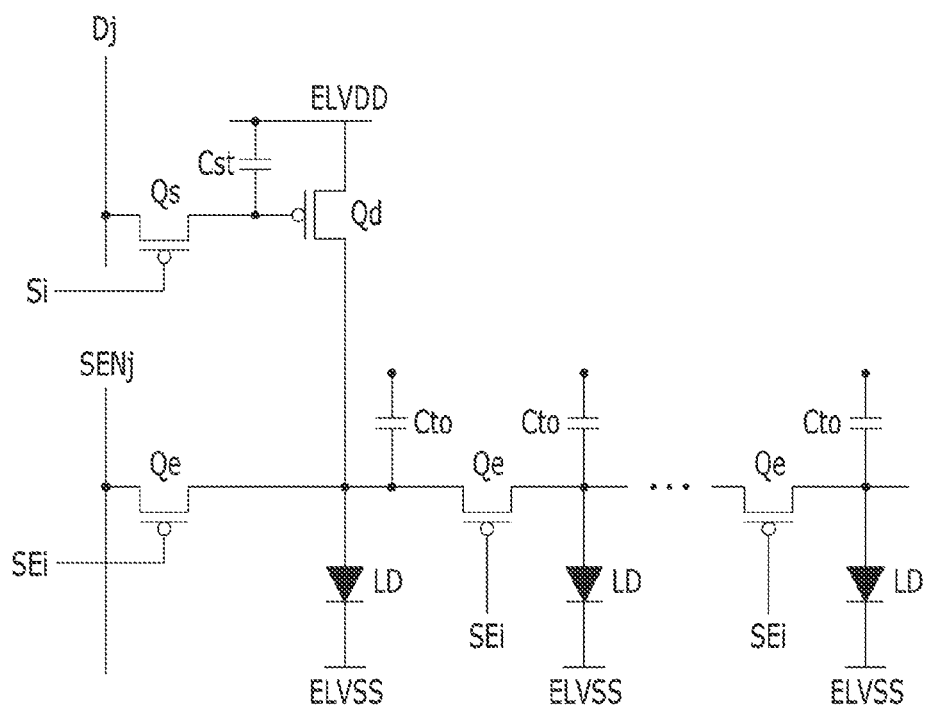
FIG. 16 and FIG. 17 show equivalent circuit diagrams of a sensing region of an organic light emitting device according to various embodiments.
Figure 17:
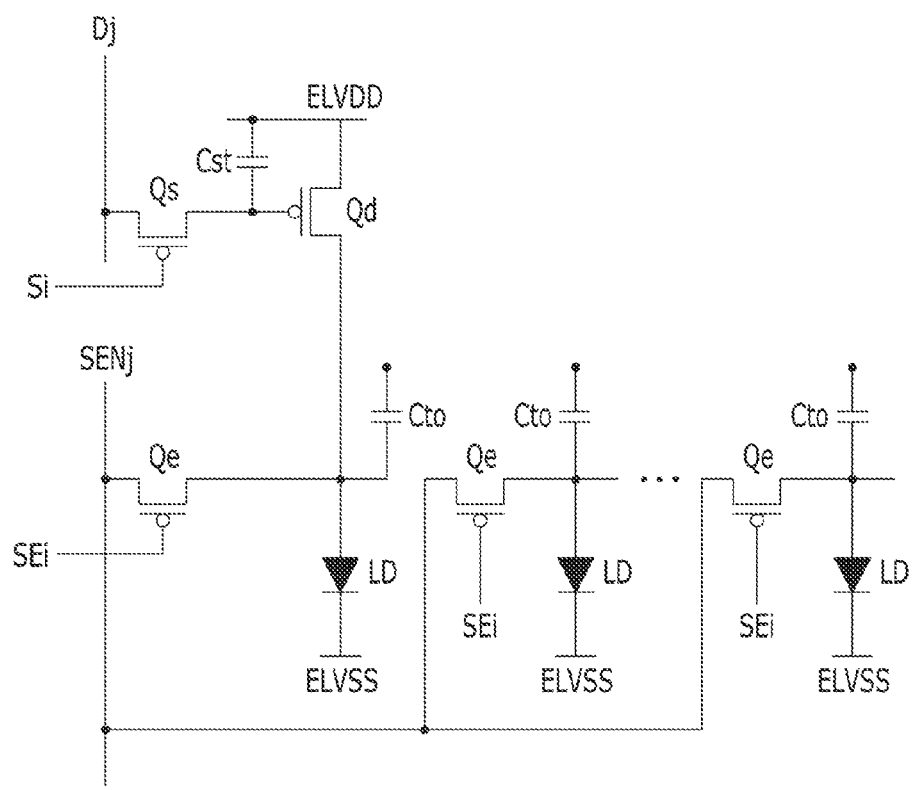

FIG. 16 and FIG. 17 show equivalent circuit diagrams of a sensing region of an organic light emitting device according to various embodiments.

Referring to FIG. 16 and FIG. 17, to increase capacitance of the touch sensing capacitor, touch sensing capacitors of a plurality of pixels PX may be coupled in parallel. In this case, a plurality of pixel bunches arranged in the row direction form a sensing region.

For example, regarding the pixel PX shown in FIG. 11, as shown in FIG. 16, the sensing transistor Qe may be connected between the sensing line SENj and the anode of the organic light emitting element LD in one pixel PX, and the sensing transistor Qe may be connected between an anode of an organic light emitting element LD of a neighboring pixel and the anode of the present organic light emitting element LD in another pixel PX. Therefore, when the sensing transistor Qe is turned on, touch sensing transistors Cto of a plurality of pixels PX may be coupled in parallel.

Differing from this, as shown in FIG. 17, the sensing transistor Qe may be connected between one sensing line SENj and the anode of the present organic light emitting element LD in the pixels PX to be coupled in parallel.

A detailed configuration of an organic light emitting device according to various embodiments will now be described with reference to FIG. 18 to FIG. 25.

Figure 18:
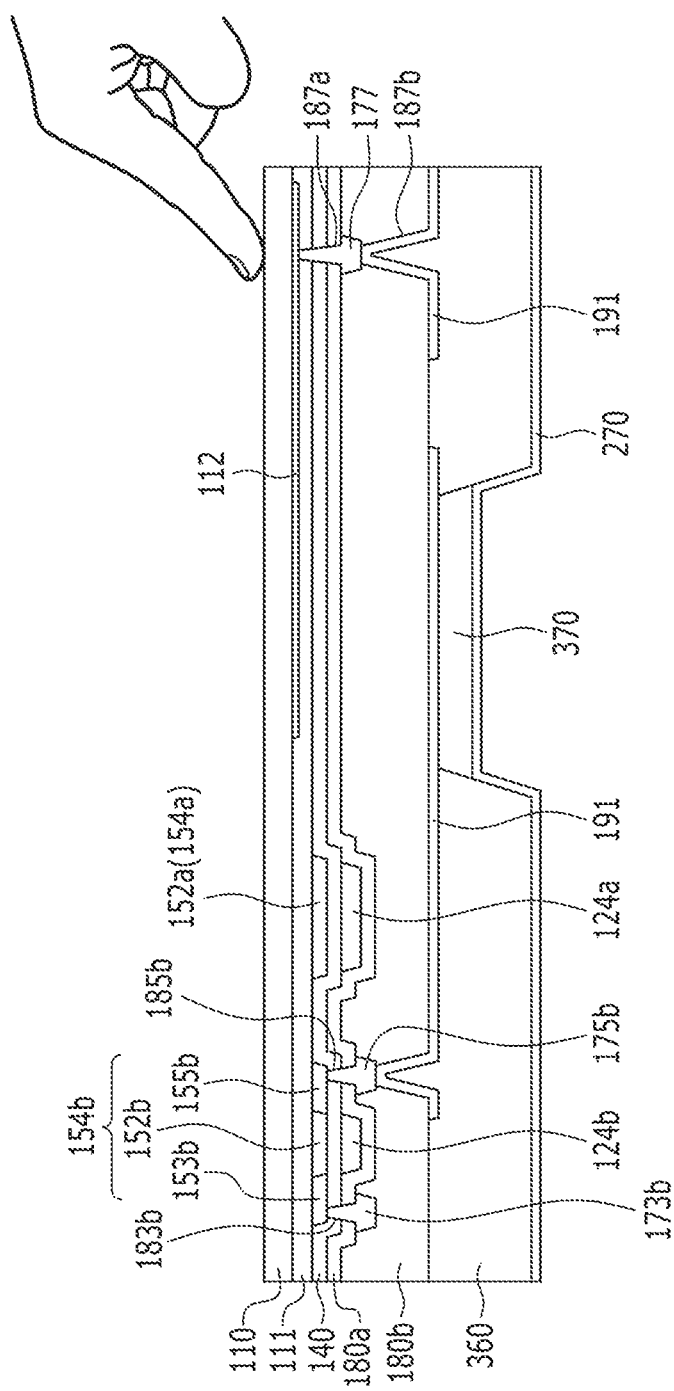
FIG. 18 and FIG. 19 show cross-sectional views of an example of one pixel of an organic light emitting device shown in FIG. 2.
Figure 19:
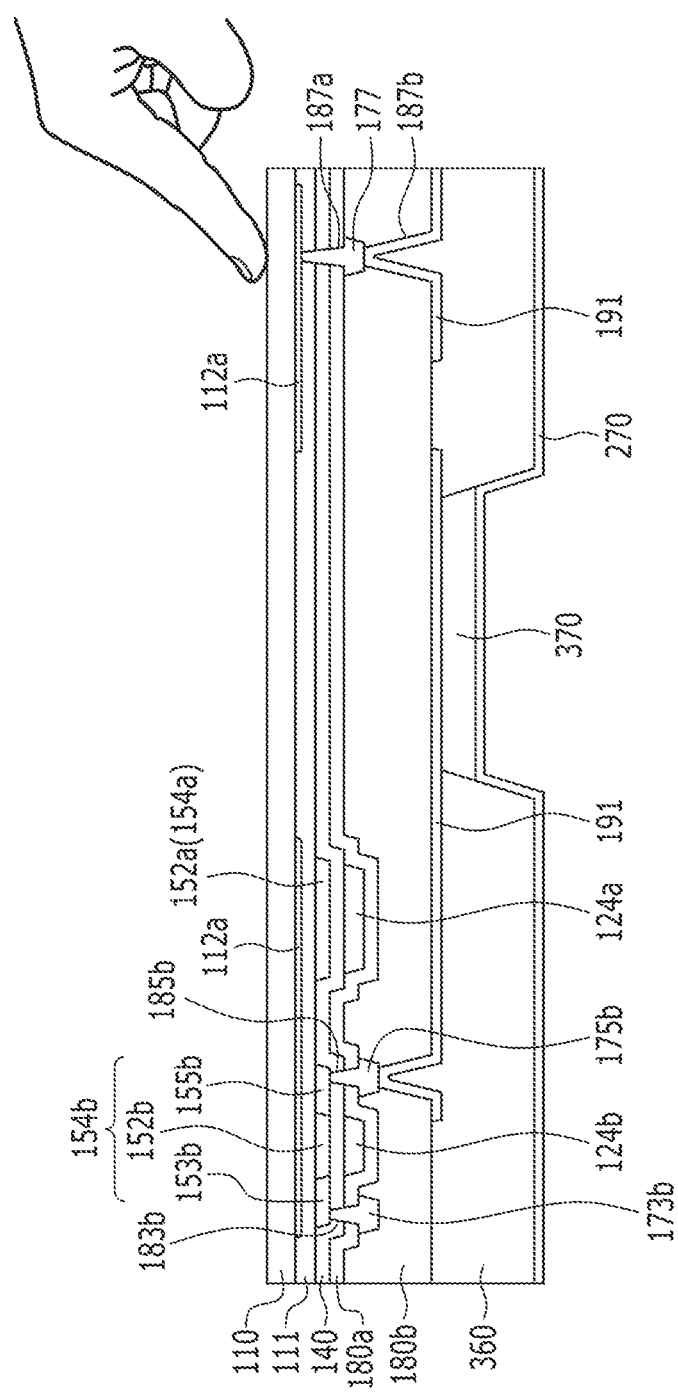
Figure 20:
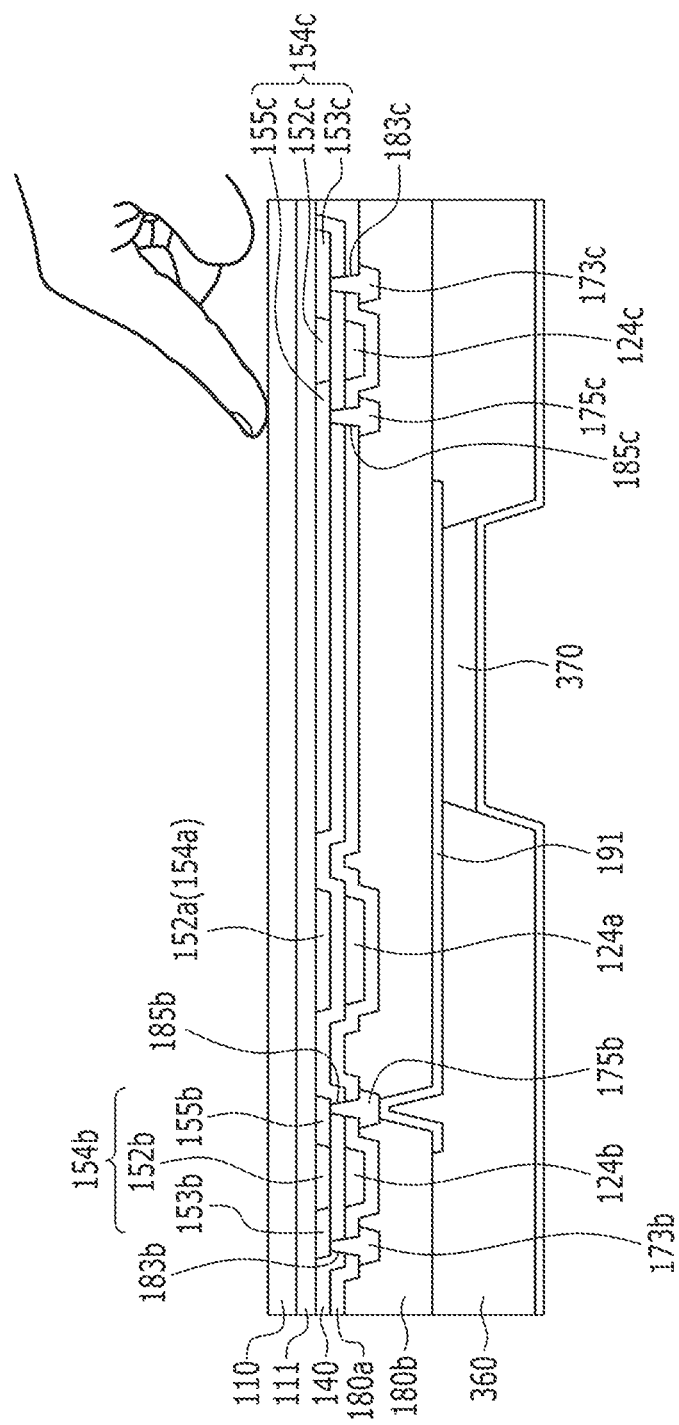
FIG. 20 shows a cross-sectional view of an example of one pixel of an organic light emitting device shown in FIG. 7.
Figure 21:
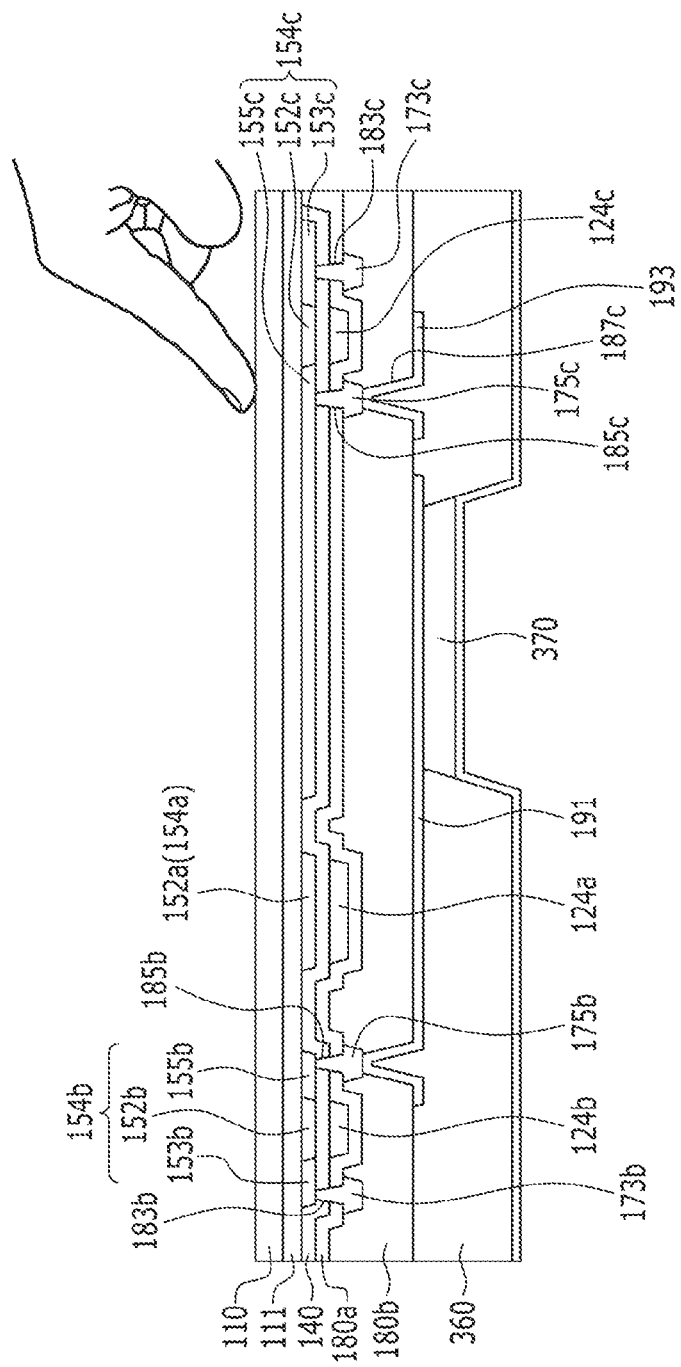
FIG. 21 shows a cross-sectional view of an example of one pixel of an organic light emitting device shown in FIG. 9.
Figure 22:
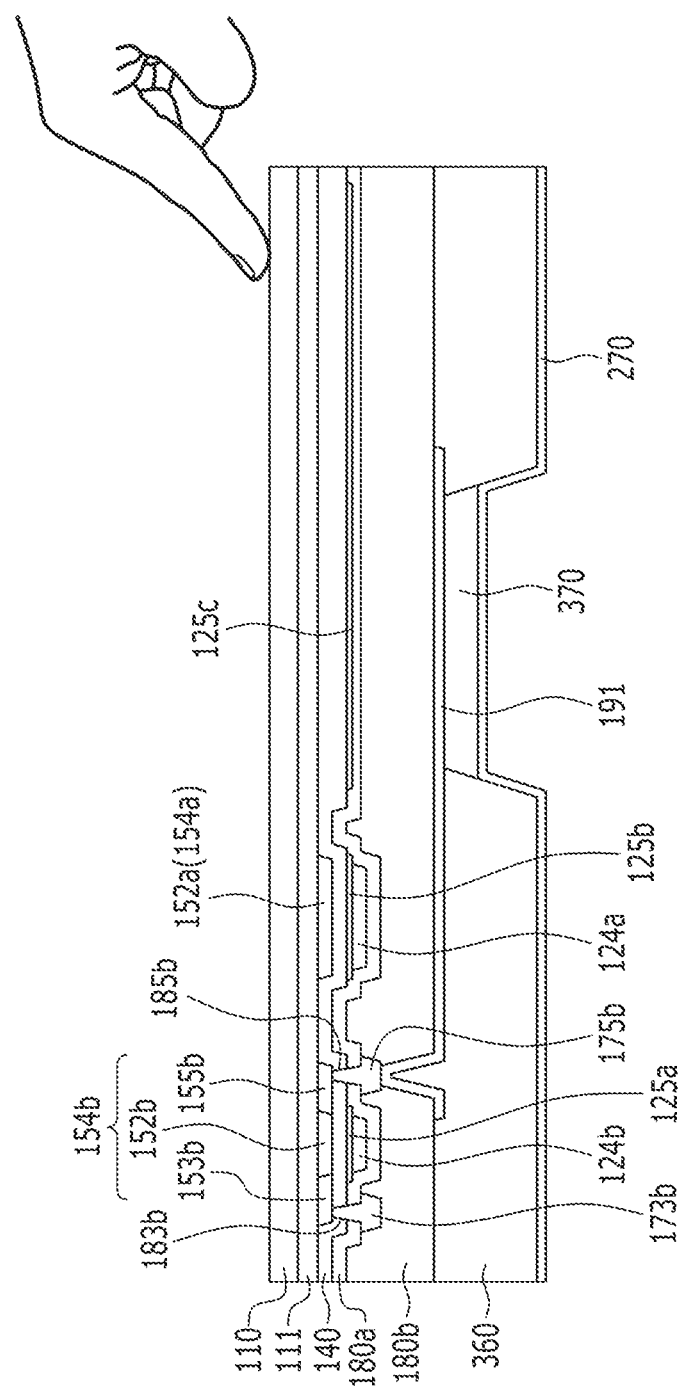
FIG. 22 shows a cross-sectional view of an example of one pixel of an organic light emitting device shown in FIG. 10.
Figure 23:
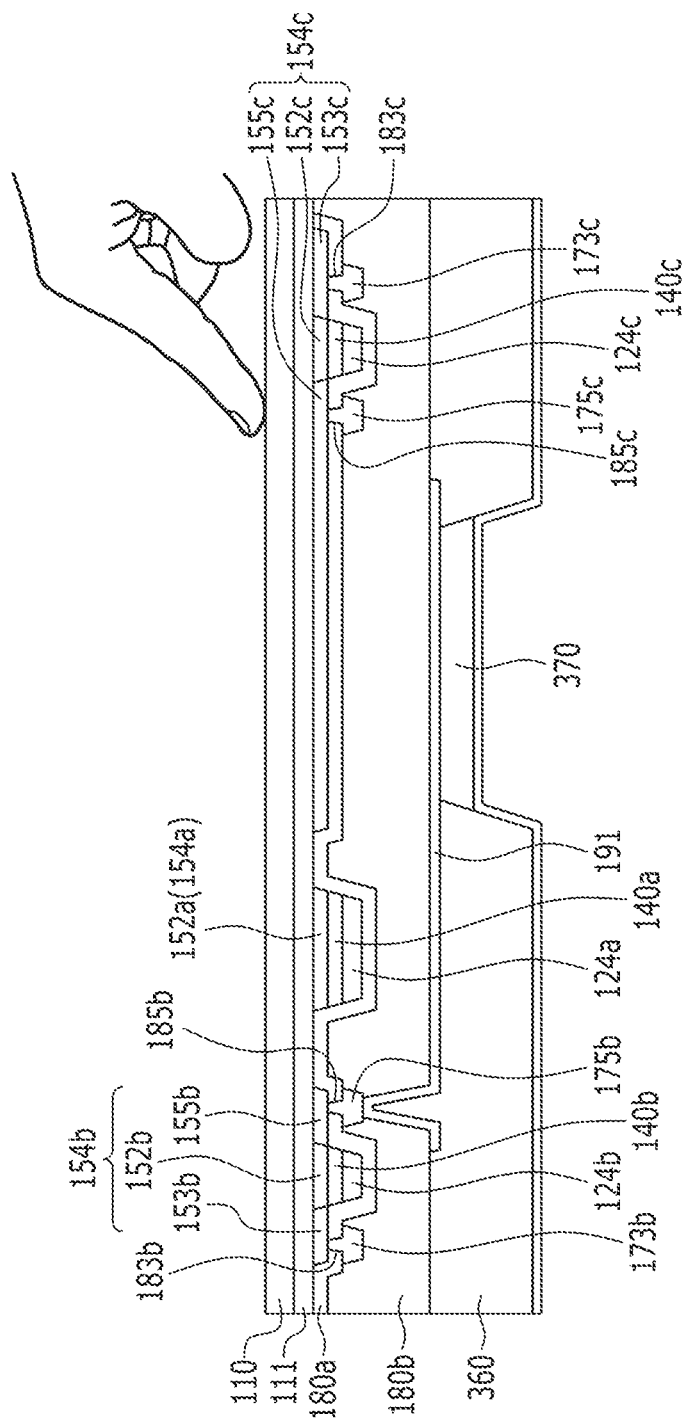
FIG. 23 and FIG. 24 show cross-sectional views of another example of one pixel of an organic light emitting device shown in FIG. 7.
Figure 24:
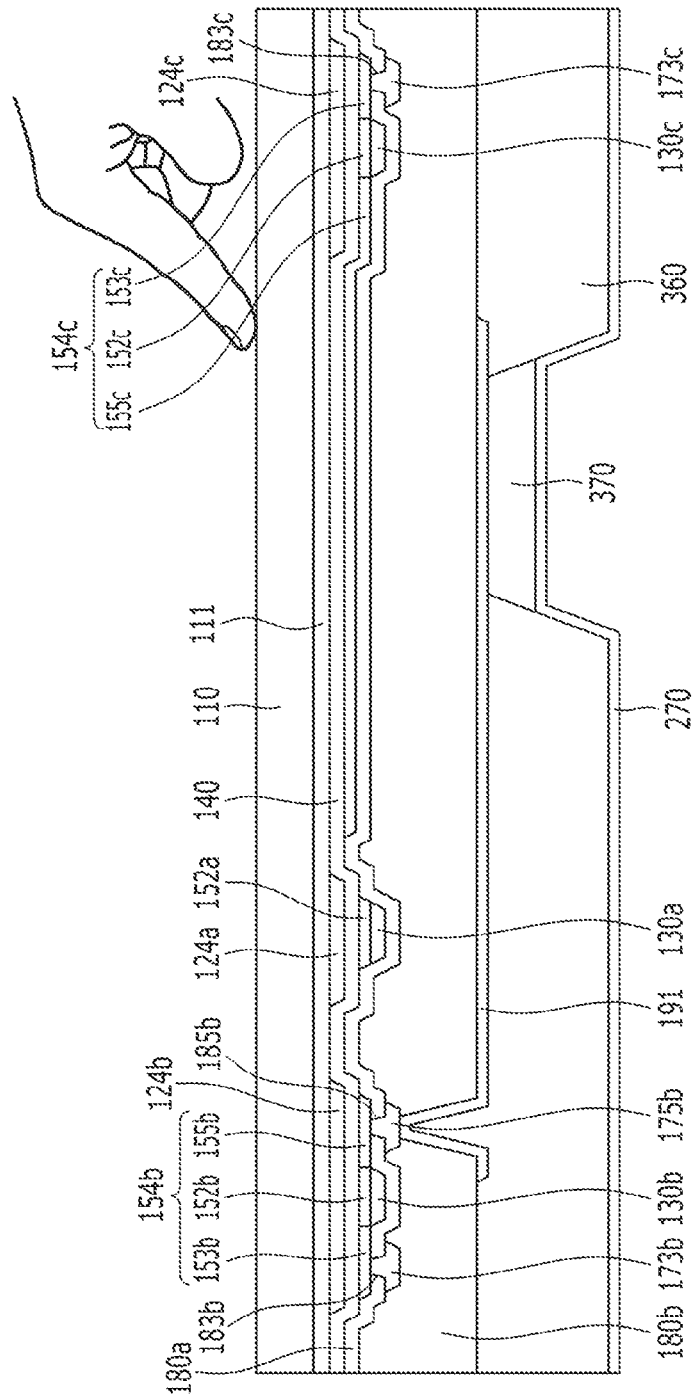
Figure 25:
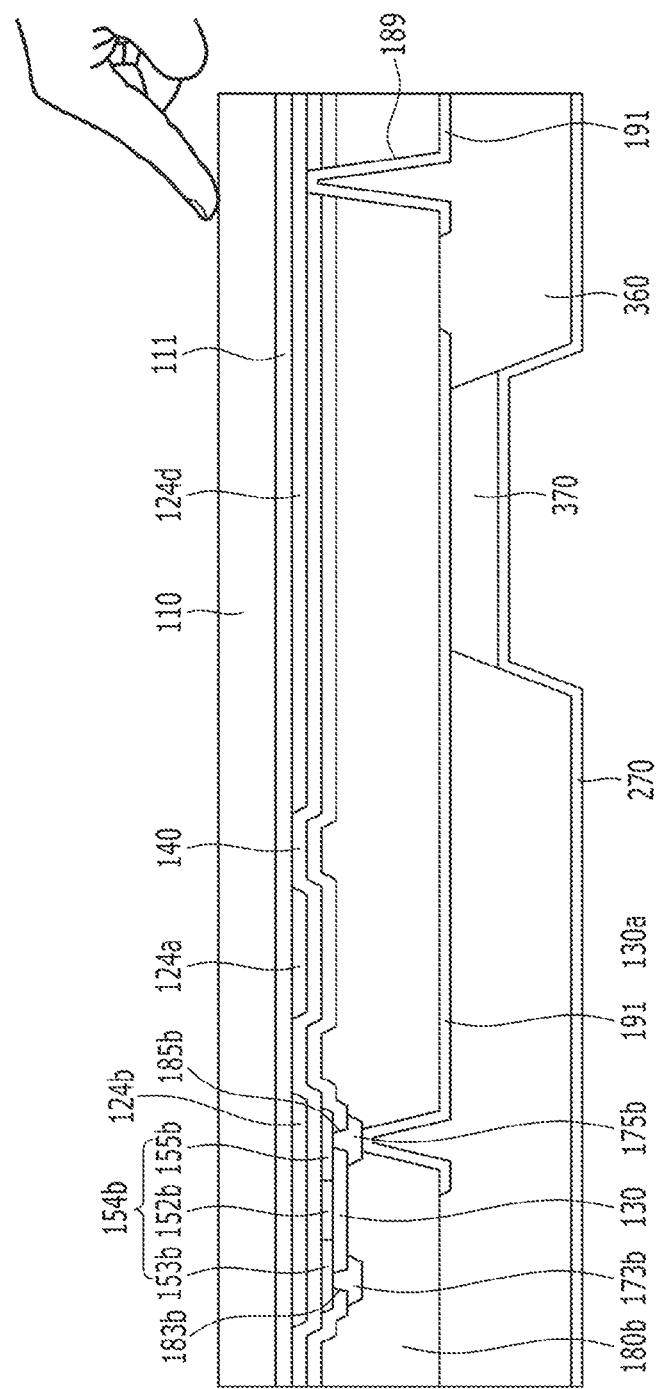
FIG. 25 shows a cross-sectional view of another example of one pixel of an organic light emitting device shown in FIG. 2.

FIG. 18 and FIG. 19 show cross-sectional views of an example of one pixel of an organic light emitting device shown in FIG. 2. FIG. 20 shows a cross-sectional view of an example of one pixel of an organic light emitting device shown in FIG. 7. FIG. 21 shows a cross-sectional view of an example of one pixel of an organic light emitting device shown in FIG. 9. FIG. 22 shows a cross-sectional view of an example of one pixel of an organic light emitting device shown in FIG. 10. FIG. 23 and FIG. 24 show cross-sectional views of another example of one pixel of an organic light emitting device shown in FIG. 7. FIG. 25 shows a cross-sectional view of another example of one pixel of an organic light emitting device shown in FIG. 2. The organic light emitting device according to an embodiment is a bottom emission type, so FIG. 18, FIG. 19, FIG. 20, FIG. 21, FIG. 22, FIG. 23, FIG. 24, and FIG. 25 show that the rear side is provided upward, for convenience. Further, FIG. 18, FIG. 19, FIG. 20, FIG. 21, FIG. 22, FIG. 23, FIG. 24, and FIG. 25 do not illustrate all of switching elements and wires.

Referring to FIG. 18, a buffer layer 111 is provided on a rear substrate 110 that is an insulation substrate made of transparent glass or plastic. The buffer layer 111 may prevent permeation of impurities, and its surface may be flat. The buffer layer 111 may include a silicon nitride (SiNx), a silicon oxide (SiOx), or a silicon oxynitride (SiOxNy). The buffer layer 111 may be omitted.

A first semiconductor layer 154a and a second semiconductor layer 154b are formed on the buffer layer 111. The first semiconductor layer 154a may include a channel region 152a, and a source region (not shown) and a drain region (not shown) provided on respective sides of the channel region 152a and formed through doping. The second semiconductor layer 154b may include a channel region 152b and a source region 153b and drain region 155b provided on respective sides of the channel region 152b and formed through doping. The source region 153b and the drain region 155b are operable as a first input/output terminal and a second input/output terminal of the driving transistor (Qd of FIG. 2), for example, of the driving element. The first semiconductor layer 154a and the second semiconductor layer 154b may include an amorphous silicon, a polysilicon, or an oxide semiconductor.

A gate insulating layer 140 made of a silicon nitride (SiNx) or a silicon oxide (SiOx) is provided on the first semiconductor layer 154a and the second semiconductor layer 154b.

For example, a plurality of gate conductors including a first gate electrode 124a operable as a control terminal of the switching transistor Qs and a second gate electrode 124b operable as a control terminal of the driving transistor Qd are formed on the gate insulating layer 140. The first gate electrode 124a may overlap part of the first semiconductor layer 154a, particularly the channel region 152a, and the second gate electrode 124b may overlap part of the second semiconductor layer 154b, particularly the channel region 152b.

A first passivation layer 180a is provided on the gate insulating layer 140 and the gate conductor. The first passivation layer 180a and the gate insulating layer 140 include a contact hole 183b extending to and for exposing the source region 153b of the second semiconductor layer 154b, and a contact hole 185b extending to and for exposing the drain region 155b. The first passivation layer 180a may further include a contact hole (not shown) for exposing a source region (not shown) and a drain region not shown) of the first semiconductor layer 154a.

A plurality of data conductors including a data line (not shown), a driving voltage line (not shown), and a plurality of input and output electrodes 173b and 175b are formed on the first passivation layer 180a.

The first input and output electrode 173b and the second input and output electrode 175b may be islands separable from each other, and may be connected to the source region 153b and the drain region 155b of the second semiconductor layer 154b through the contact holes 183b and 185b. The first input and output electrode 173b may be formed to be part of a driving voltage line for transmitting a driving voltage.

A second passivation layer 180b made of an inorganic insulator such as a silicon nitride or a silicon oxide may be provided on the data conductor. The second passivation layer 180b may remove steps and may have a flat surface to increase an emission efficiency of the organic light emitting element to be formed thereon. The second passivation layer 180b may have a contact hole extending to and for exposing the second input and output electrode 175b.

A pixel electrode 191 is provided on the second passivation layer 180b. The pixel electrode 191 may include a semi-transmissible or transmittable material.

The pixel electrode 191 of the pixel PX is physically and electrically connected to the second input and output electrode 175b through the contact hole of the second passivation layer 180b.

A pixel defining layer (also called a partition) 360 with an opening extending to and for exposing the pixel electrode 191 may be provided on the second passivation layer 180b. The opening of the pixel defining layer 360 may define the pixel area.

An emission member 370 is provided on the pixel defining layer 360 and the pixel electrode 191. The emission member 370 may include a first organic common layer (not shown), an emission layer (not shown), and a second organic common layer (not shown) that are stacked sequentially.

The first organic common layer may exemplarily include at least one of a hole injecting layer and a hole transport layer that are stacked sequentially. The first organic common layer may be formed all over the display area in which the pixels PX are disposed, or may be formed in each pixel area.

The emission layer may be provided on the pixel electrode 191 of the corresponding pixel PX. The emission layer may be made of an organic material which uniquely emits light of primary colors such as red, green, and blue, and may have a structure in which a plurality of organic material layers emitting light of different colors are laminated. For example, a red organic emission layer may be deposited on the first organic common layer of the pixel PX representing red, a green organic emission layer may be deposited on the first organic common layer of the pixel PX representing green, and a blue organic emission layer may be deposited on the first organic common layer of the pixel PX representing blue. However, it is not limited thereto, and an organic emission layer representing one primary color may be deposited in the pixel PX representing the different colors. According to another embodiment, the emission layer may include a white emission layer expressing white.

For example, the second organic common layer may include at least one of the electron transport layer (ETL) and the electron injection layer (EIL) that are sequentially deposited. The second organic common layer may be formed throughout the entire display area where the pixel PX is disposed, or may be formed in the region of each pixel PX.

The first and second organic common layers improve the luminous efficiency of the emission layer, and one of the first and second organic common layers may be omitted.

A common electrode 270 for transmitting a common voltage ELVSS is formed on the emission member 370. The common electrode 270 may include a reflective material. For example, the common electrode 270 is made of the transparent conductive material or is formed by thinly depositing a metal such as calcium (Ca), barium (Ba), magnesium (Mg), aluminum (Al), and silver (Ag) to allow light transmittance.

The pixel electrode 191, the light emitting member 370, and the common electrode 270 of each pixel PX form the organic light emitting element LD, previously described, and one of the pixel electrode 191 and the common electrode 270 may be a cathode, while the other may be an anode.

A touch electrode 112 is formed between the rear substrate 110 and the buffer layer 111. The touch electrode 112 may include a transparent conductive material. In this case, the touch electrode 112 may be extended to a region corresponding to the emission member 370 of the pixel PX. The buffer layer 111, the gate insulating layer 140, and the first passivation layer 180a have a contact hole 187a extending to and for exposing the touch electrode 112. A connection electrode 177 is formed in the contact hole 187a as an island. The pixel electrode 191 is connected to the connection electrode 177 through a contact hole 187b formed in the second passivation layer 180b so the touch electrode 112 is connected to the pixel electrode 191.

Therefore, the pixel electrode 191, that is, the touch electrode 112 connected to the anode of the organic light emitting element LD, may function as an electrode of the touch sensing capacitor Cto shown in FIG. 2.

In another embodiment, as shown in FIG. 19, a touch electrode 112a may be formed throughout the display area to expose the region that corresponds to the emission member 370 of the pixel PX. In this case, the touch electrode 112a may include a reflective conductive material. The touch electrode 112a may then function as an electrode of the touch sensing capacitor Cto shown in FIG. 5, and may reduce reflectance of the organic light emitting device.

In another embodiment, as shown in FIG. 20, a third semiconductor layer 154c is formed on the buffer layer 111. The third semiconductor layer 154c may include a channel region 152c and a source region 153c and drain region 155c provided on respective sides of the channel region 152c and formed through doping. The source region 153c and the drain region 155c are exemplarily operable as a first input/output terminal and a second input/output terminal of the sensing transistor (Qe of FIG. 2).

A third gate electrode 124c that is operable as a control terminal of the sensing transistor Qe is formed on the gate insulating layer 140. The third gate electrode 124c may overlap part of the third semiconductor layer 154c, particularly the channel region 152c.

The first passivation layer 180a and the gate insulating layer 140 further include a contact hole 183c for exposing the source region 153c of the third semiconductor layer 154c and a contact hole 185c for exposing the drain region 155c.

A first input and output electrode 173c and a second input and output electrode 175c that are separable from each other are formed on the first passivation layer 180a. The first input and output electrode 173c and the second input and output electrode 175c may be connected to the source region 153c and the drain region 155c of the third semiconductor layer 154c through the contact holes 183c and 185c. The first input and output electrode 173c may be connected to the data line or the sensing line.

Here, a partial region of the third semiconductor layer 154c, for example, the drain region 155c, may extend to the region corresponding to the emission member 370 and form a touch electrode of the pixel PX shown in FIG. 7.

In another embodiment, as shown in FIG. 21, an auxiliary electrode 193 is further provided on the second passivation layer 180b. The auxiliary electrode 193 is separated from the pixel electrode 191, and is connected to the second input and output electrode 175c through a contact hole 187c of the second passivation layer 180b. Therefore, the pixel electrode 191 and the auxiliary electrode 193 may form the capacitor Cm shown in FIG. 9.

In another embodiment, as shown in FIG. 22, the gate electrodes 124a and 124b may be formed with two layers. A gate conductor made of a transparent conductive material may be formed on the gate insulating layer 140, and gate electrodes 124a and 124b may be formed on the gate conductor made of a transparent conductive material. When the double-layered gate electrodes are formed as described, parts 125a, 125b, and 125c of the gate conductor of a transparent conductive material may remain through selective etching. In this instance, the gate conductor 125c in the region corresponding to the emission member 370 is formed to be connected to the gate electrode 124b formed on the second semiconductor layer 154b. The gate conductor 125c may then function as an electrode of the touch sensing capacitor Cto2 shown in FIG. 10.

In the other embodiment, a gate self-alignment configuration may be used as shown in FIG. 23. The first semiconductor layer 154a, the second semiconductor layer 154b, and the third semiconductor layer 154c may include an oxide semiconductor. In this case, the gate insulating layers 140a, 104b, and 140c may be formed in the channel regions 152a, 152b, and 152c of the semiconductor layers 154a, 154b, and 154c through selective etching. A partial region of the third semiconductor layer 154c, for example, the drain region 155c may extend to the region corresponding to the emission member 370 to form a touch electrode of the pixel PX shown in FIG. 7.

In another embodiment, as shown in FIG. 24 and FIG. 25, the gate electrodes 124a, 124b, and 124c may be formed below the semiconductor layers 154a, 154b, and 154c.

Referring to FIG. 24, a gate conductor including gate electrodes 124a, 124b, and 124c is formed on the buffer layer 111 and the gate insulating layer 140 covers the gate conductor. The first semiconductor layer 154a, the second semiconductor layer 154b, and the third semiconductor layer 154c are formed on the gate insulating layer 140. The first semiconductor layer 154a, the second semiconductor layer 154b and the third semiconductor layer 154c may include an oxide semiconductor. The first gate electrode 124a may overlap part of the first semiconductor layer 154a, the second gate electrode 124b may overlap part of the second semiconductor layer 154b and the third gate electrode 124c may overlap part of the third semiconductor layer 154c.

An etch stopper (also called an etching preventing layer) 130a is provided in the channel region 152a of the first semiconductor layer 154a, an etch stopper 130b is provided in the channel region 152b of the second semiconductor layer 154b, and an etch stopper 130c is provided in the channel region 152c of the third semiconductor layer 154c. In this instance, right and left edge borders of the etch stoppers 130a, 130b, and 130c may be substantially arranged to correspond to right and left edge borders of the channel regions 152a, 152b, and 152c. Therefore, the etch stoppers 130a, 130b, and 130c may not substantially overlap the source region or the drain region.

The first passivation layer 180a covers the etch stoppers 130a, 130b and 130c. The etch stoppers 130a, 130b, and 130c cover the channel regions 152a, 152b, and 152c to prevent the channel regions 152a, 152b, and 152c from being damaged by an etchant. The etch stoppers 130a, 130b and 130c prevent diffusion of impurities to the channel regions 152a, 152b, and 152c from an insulating layer such as the first passivation layer 180*a* or the outside to prevent a change of properties of the channel regions 152*a*, 152*b*, and 152*c*.

The etch stoppers 130*a*, 130*b*, and 130*c* may be formed of an inorganic layer including at least one material of SiOx, SiNx, SiOCx, and SiONx, or an organic layer including an organic material or a polymer organic material.

In this instance, a partial region of the third semiconductor layer 154*c*, for example, the drain region 155*c*, extends to the region corresponding to the emission member 370 to form a touch electrode of the pixel PX shown in FIG. 7.

Referring to FIG. 25, differing from FIG. 24, the etch stopper 130 covers the first and second semiconductor layers 154*a* and 154*b* and the gate insulating layer 140 on which the semiconductor layers 154*a* and 154*b* are not formed. The etch stopper 130 includes a contact hole 183*b* for exposing the source region 153*b* of the second semiconductor layer 154*b* and a contact hole 185*b* for exposing the drain region 155*b*. The etch stopper 130 may further include a contact hole (not shown) for exposing a source region (not shown) and a drain region (not shown) of the first semiconductor layer 154*a*. The first passivation layer (not shown) may cover the etch stopper 130.

A touch electrode 124*d* is formed on the same layer as the gate conductor. The touch electrode 124*d* may include a transparent conductive material. In this case, the touch electrode 124*d* may be extended to the region corresponding to the emission member 370 of the pixel PX. The gate insulating layer 140 and the second passivation layer 180*b* have a contact hole 189 for exposing the touch electrode 124*d*. The pixel electrode 191 is connected to the touch electrode 124*d* through the contact hole 189.

Therefore, the pixel electrode 191, that is, the touch electrode 124*d* connected to the anode of the organic light emitting element LD, may function as an electrode of the touch sensing capacitor Cto shown in FIG. 2, thereby providing the touch sensing function without increasing the thickness or the weight of the organic light emitting device according to the various embodiments.

While this disclosure has been described in connection with what is presently considered to be practical embodiments, it is to be understood that the inventive concept is not limited to the disclosed embodiments, but on the contrary, is intended to cover various modifications and equivalent arrangements included within the spirit and scope of the appended claims.

What is claimed is:

1. A display device comprising:
   at least one signal line configured to transmit a data signal and a sensing signal;
   a scan line configured to transmit a scan signal;
   a pixel including a touch electrode configured to store a voltage corresponding to the sensing signal for a first period when an external touch occurs, and disposed in a region defined by the signal line and the scan line; and
   a sensing signal processor configured to measure a voltage stored in the touch electrode through the signal line for a second period after the first period, to measure a voltage of the signal line for a third period after the second period, and to sense the external touch based upon a difference between the voltage measured for the second period and the voltage measured for the third period, wherein the sensing signal processor includes:
   an operational amplifier including a first input terminal connected to the signal line, a second input terminal for receiving a reference voltage, and an output terminal;
   a first capacitor;
   a second capacitor;
   a first switching element connected between the output terminal and the first capacitor and configured to be turned on for the second period; and
   a second switching element connected between the output terminal and the second capacitor and configured to be turned on for the third period,
   wherein the pixel further includes:
   a switching transistor configured to transmit the data signal in response to the scan signal;
   a capacitor configured to store a voltage corresponding to the data signal from the switching transistor;
   a driving transistor configured to output a current caused by the voltage stored in the capacitor; and
   an organic light emitting diode configured to emit light according to the current from the driving transistor, and
   wherein the touch electrode is directly connected to an anode of the organic light emitting diode.

2. The display device of claim 1, further comprising a sensing transistor configured to be turned on for the first period to transmit a voltage stored in the touch electrode to the signal line.

3. The display device of claim 2, wherein the sensing transistor includes a first input/output terminal connected to the signal line and a second input/output terminal connected to the touch electrode.

4. The display device of claim 1, wherein the signal line includes a data line configured to transmit the data signal and a sensing line configured to transmit the sensing signal.

5. The display device of claim 1, wherein the signal line includes a data line configured to transmit the data signal for a displaying period and to transmit the sensing signal for a touch sensing period, and
   the touch sensing period includes the first period, the second period, and the third period.

6. A touch sensing method by a display device including at least one signal line for transmitting a data signal and a sensing signal, a scan line for transmitting a scan signal, a pixel disposed in a region defined by the signal line and the scan line and including a touch electrode, and a sensing signal processor, comprising:
   storing a voltage corresponding to the sensing signal in the touch electrode for a first period when an external touch occurs;
   measuring the voltage stored in the touch electrode through the signal line for a second period after the first period with the sensing signal processor;
   measuring the voltage at the signal line for a third period after the second period with the sensing signal processor; and
   sensing the external touch based upon a difference between the voltage measured for the second period and the voltage measured for the third period with the sensing signal processor, wherein the sensing signal processor includes:
   an operational amplifier including a first input terminal connected to the signal line, a second input terminal for receiving a reference voltage, and an output terminal;
   a first capacitor;
   a second capacitor;
   a first switching element connected between the output terminal and the first capacitor and configured to be turned on for the second period; and a second switching element connected between the output terminal and the second capacitor and configured to be turned on for the third period, wherein the pixel further includes:

a switching transistor configured to transmit the data signal in response to the scan signal;

a capacitor configured to store a voltage corresponding to the data signal from the switching transistor;

a driving transistor configured to output a current caused by the voltage stored in the capacitor; and an organic light emitting diode configured to emit light according to the current from the driving transistor, and wherein the touch electrode is directly connected to an anode of the organic light emitting diode.

* * * * *